(12) United States Patent
Dewey et al.

(10) Patent No.: US 9,748,338 B2
(45) Date of Patent: Aug. 29, 2017

(54) PREVENTING ISOLATION LEAKAGE IN III-V DEVICES

(75) Inventors: Gilbert Dewey, Hillsboro, OR (US); Marko Radosavljevic, Beaverton, OR (US); Ravi Pillarisetty, Portland, OR (US); Benjamin Chu-Kung, Hillsboro, OR (US); Niloy Mukherjee, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 421 days.

(21) Appl. No.: 13/538,985

(22) Filed: Jun. 29, 2012

(65) Prior Publication Data
US 2014/0001519 A1 Jan. 2, 2014

(51) Int. Cl.
*H01L 29/78* (2006.01)
*H01L 21/762* (2006.01)
*H01L 29/10* (2006.01)
*H01L 29/66* (2006.01)

(52) U.S. Cl.
CPC .... *H01L 29/1054* (2013.01); *H01L 21/76224* (2013.01); *H01L 29/66795* (2013.01); *H01L 29/785* (2013.01)

(58) Field of Classification Search
CPC .................................................. H01L 29/1054
See application file for complete search history.

(56) References Cited

U.S. PATENT DOCUMENTS

| 5,753,966 A * | 5/1998 | Morita .................. H01S 5/0201 257/200 |
| 2001/0055764 A1* | 12/2001 | Empedocles .......... B82Y 15/00 435/6.11 |
| 2007/0235763 A1 | 10/2007 | Doyle et al. |
| 2010/0163842 A1* | 7/2010 | Lai et al. ........................ 257/19 |

(Continued)

FOREIGN PATENT DOCUMENTS

| JP | 06-163912 A | 6/1994 |
| KR | 10-2005-0017584 A | 2/2005 |

(Continued)

OTHER PUBLICATIONS

PCT International Search Report for PCT/US2013/044585, mailed Nov. 13, 2013 (3 pp.).

(Continued)

*Primary Examiner* — Kimberly Rizkallah
*Assistant Examiner* — Mounir Amer
(74) *Attorney, Agent, or Firm* — Schwabe, Williamson & Wyatt P.C.

(57) ABSTRACT

A fin is formed over a first barrier layer over a substrate. The first barrier layer has a band gap greater than the band gap of the fin. In one embodiment, a gate dielectric layer is deposited on the top surface and opposing sidewalls of the fin and is adjacent to a second barrier layer deposited on the first barrier layer underneath the fin. In one embodiment, the gate dielectric layer is deposited on the top surface and the opposing sidewalls of the fin and an isolating layer is formed adjacent to the first barrier layer underneath the fin. In one (Continued)

embodiment, the gate dielectric layer is deposited on the top surface and the opposing sidewalls of the fin, and an isolating layer is formed adjacent to the second barrier layer deposited between the fin and the first barrier layer.

11 Claims, 12 Drawing Sheets

(56) References Cited

U.S. PATENT DOCUMENTS

| | | | | |
|---|---|---|---|---|
| 2010/0163849 | A1* | 7/2010 | Radosavlijevic | B82Y 10/00 257/24 |
| 2010/0163926 | A1* | 7/2010 | Hudait et al. | 257/190 |
| 2010/0301307 | A1* | 12/2010 | Fattal | H01L 33/06 257/13 |
| 2011/0147711 | A1* | 6/2011 | Pillarisetty et al. | 257/24 |
| 2012/0056245 | A1* | 3/2012 | Kang | H01L 21/0245 257/192 |
| 2013/0146959 | A1* | 6/2013 | Cheng | H01L 29/66181 257/310 |

FOREIGN PATENT DOCUMENTS

| | | |
|---|---|---|
| KR | 10-2008-0088973 A | 10/2008 |
| KR | 10-2010-0111241 A | 10/2010 |

OTHER PUBLICATIONS

Radosavljevic, M., et al., "Advanced High-K Gate Dielectric for High-Performance Short-Channel $In_{0.7}Ga_{0.3}As$ Quantum Well Field Effect Transistors on Silicon Substrate for Low Power Logic Applications," Electron Devices Meeting (IEDM), 2009 IEEE International, pp. 13.1.1-13.1.4.

PCT International Preliminary Report on Patentability for PCT/US2013/044585, mailed Dec. 31, 2014 (5 pp.).

Taiwan (R.O.C.) Patent Application No. 102121773, Official Communication and Search Report mailed Jan. 16, 2015, 14 pages, (Only English Translation of the Search Report).

Taiwan (R.O.C.) Patent Application No. 102121773, Notice of Allowance mailed Aug. 28, 2015, (with English translation) 3 pages.

Taiwan (R.O.C.) Patent Application No. 102121773, Allowed Claims mailed Aug. 28, 2015, (with English translation) 47 pages.

* cited by examiner

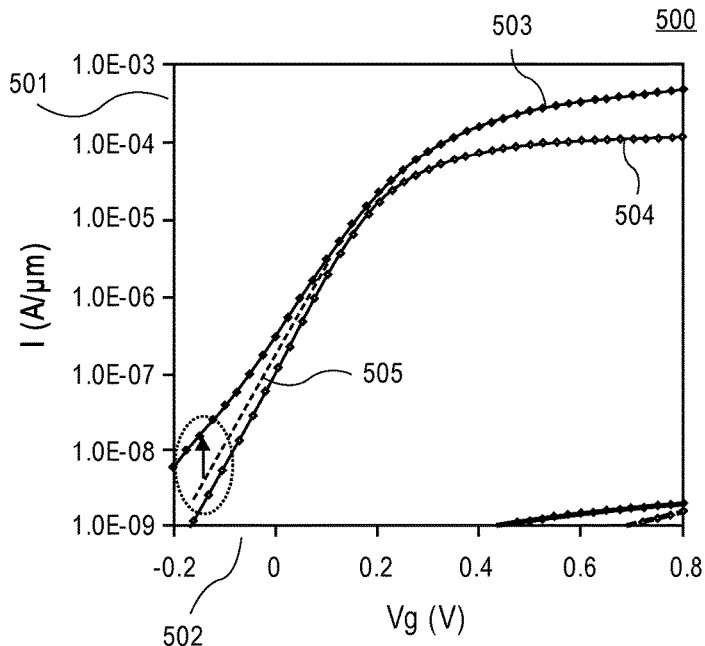
FIG. 5
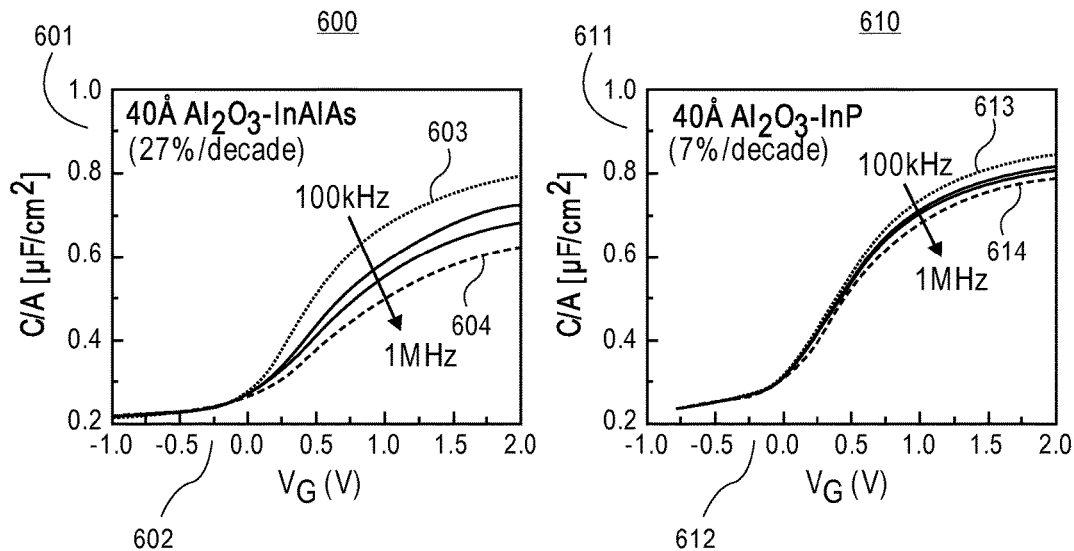
FIG. 6A   FIG. 6B

PREVENTING ISOLATION LEAKAGE IN III-V DEVICES

TECHNICAL FIELD

Embodiments of the invention relate to the field of electronic device manufacturing; and more specifically, to fabrication of III-V electronic devices.

BACKGROUND ART

The scaling of features in integrated circuits enables increased densities of electronic devices on the limited real estate of the integrated circuit chip. Generally, the performance of electronic devices on the integrated circuit chip (e.g., transistors, resistors, capacitors, etc) is a major factor considered during scaling of those devices. The factors affecting the electronic device performance can be, for example, a carrier mobility and saturation velocity. Group III-V element compounds, for example, gallium arsenide (GaAs), indium antimonide (InSb), indium phosphide (InP), and indium gallium arsenide (InGaAs) are known to have higher electron mobility and saturation velocity than silicon. These materials may thus provide superior device performance.

Typically, an isolation oxide or other isolation scheme is used to prevent parasitic leakage from a source to a drain of the transistor. Currently, on III-V transistors a semiconductor having a large band gap (Eg) is used as isolation. The parasitic leakage degrades the performance parameters of the III-V transistors. For example, the parasitic leakage path from the source to the drain causes increased off-state leakage current, degrades the sub-threshold slope of the current-voltage characteristics, and the ability of the device to completely turn off.

BRIEF DESCRIPTION OF THE DRAWINGS

FIG. 5 is an exemplary graph showing a current versus a gate voltage of a III-V transistor.

FIG. 6A is an exemplary graph showing a gate capacitance versus a gate voltage for an Al2O3-InAlAs interface.

FIG. 6B is an exemplary graph showing a gate capacitance versus a gate voltage for an Al2O3-InP interface.

DESCRIPTION OF THE EMBODIMENTS

Figure 1:
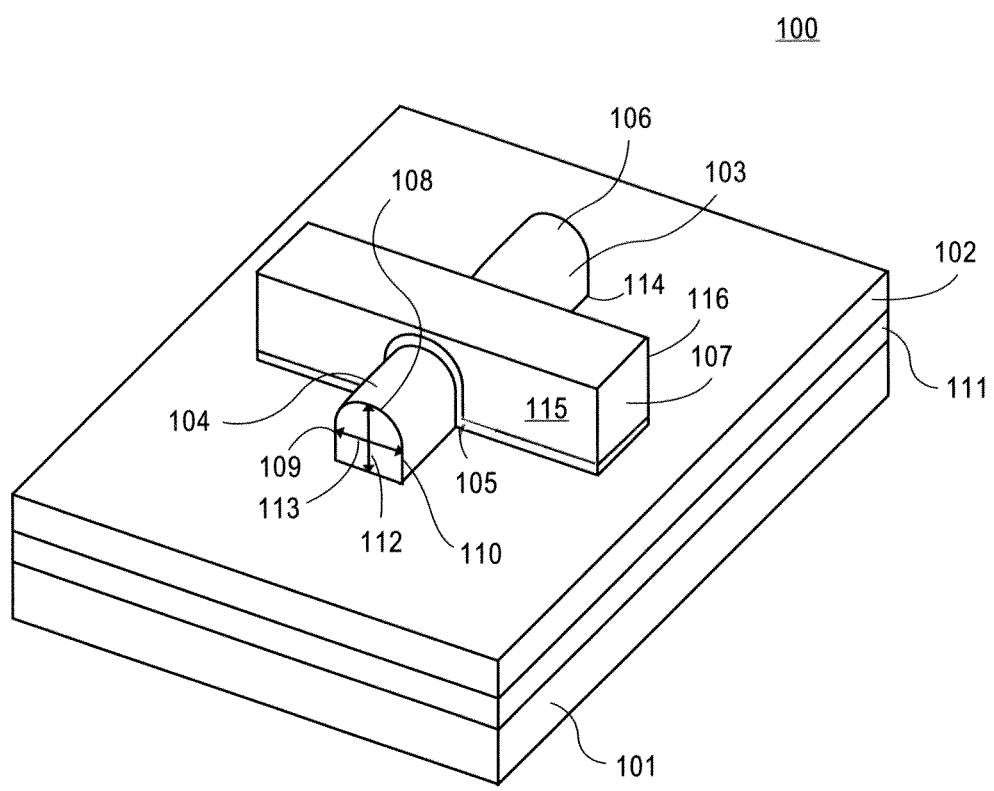
FIG. 1 is a perspective view of a non-planar III-V transistor according to one embodiment of the invention.

In the following description, numerous specific details, such as specific materials, dimensions of the elements, etc. are set forth in order to provide thorough understanding of one or more of the embodiments as described herein. It will be apparent, however, to one of ordinary skill in the art that the one or more embodiments as described herein may be practiced without these specific details. In other instances, semiconductor fabrication processes, techniques, materials, equipment, etc., have not been described in great detail to avoid unnecessarily obscuring of this description.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration within the scope of the appended claims. The description is thus to be regarded as illustrative rather than limiting.

Preventing an isolation leakage in III-V electronic devices is described herein. Typically, to fabricate an indium gallium arsenide (InGaAs) transistor, an InGaAs layer is deposited onto an indium aluminum arsenide (InAlAs) layer on a substrate. The InAlAs layer is used as a bottom barrier layer for the InGaAs transistor. Currently, to fabricate a non-planar device, a gate oxide is deposited onto an InGaAs fin. Typically, the gate oxide comes in contact with the InAlAs bottom barrier layer. The gate oxide-InAlAs interface generally has substantially high density of interface traps. This poor oxide interface at the bottom barrier below the fin can serve as a parasitic leakage path for the III-V transistor.

Embodiments of the invention as described herein reduce the isolation leakage in III-V transistors. A fin is formed over a first bottom barrier layer over a substrate. The first bottom barrier layer has a band gap greater than the band gap of the fin. Generally a band gap is referred to an energy difference (in electron volts) between the top of the valence band and the bottom of the conduction band in insulators and semiconductors, as known to one of ordinary skill of the electronic device manufacturing. In one embodiment, a second bottom barrier layer is inserted between the fin and the first bottom barrier layer, and a gate dielectric layer is formed on a top surface and opposing sidewalls of the fin and is adjacent to the second barrier layer. In one embodiment, the second barrier layer is adapted to provide better interface with the gate dielectric layer than the first barrier layer. In one embodiment, an interface between a gate dielectric layer and a second barrier interface provides at least 2 times less density of interface traps than the interface between the gate dielectric layer and a first barrier interface. In one embodiment, a gate dielectric layer is deposited on the top surface and the opposing sidewalls of the fin and an isolating layer is formed adjacent to the first barrier layer underneath the fin. In one embodiment, the isolating layer is adapted to provide better interface with the first barrier layer than the gate dielectric. In one embodiment, the gate dielectric layer is deposited on the top surface and the opposing sidewalls of the fin, and an isolating layer is formed adjacent to the second barrier layer deposited between the fin and the first barrier layer.

FIG. 1 is a perspective view of a non-planar III-V transistor according to one embodiment of the invention. As shown in FIG. 1, a non-planar transistor 100 includes a bottom barrier layer 102 on a buffer layer 111 on a substrate 101. A semiconductor fin 103 is formed on the bottom barrier layer 102. In one embodiment, the bottom barrier layer includes a material having a band gap that is greater than the band gap of the material of the fin, such as fin 103. As shown in FIG. 1, the fin 103 has a top surface 108 and opposing sidewalls, such as a sidewall 109 and a sidewall 110. A gate dielectric layer 105 is deposited on the fin 103 covering the top surface 108, the opposing sidewalls 109 and 110, and bottom barrier layer 102.

In one embodiment, bottom barrier layer 102 includes a first (lower) bottom barrier layer, and a second (upper) bottom barrier layer deposited on the first barrier layer. In one embodiment, the second bottom barrier layer is adapted to provide better interface with the gate dielectric layer than the first bottom barrier layer, as described in further detail below. In one embodiment, the second bottom barrier layer has a greater band gap than the fin 103. In one embodiment, the first bottom barrier layer has a greater band gap than the fin 103. In one embodiment, where barrier layer 102 has a second bottom barrier layer, an isolating layer that is different from the gate dielectric layer is deposited on the second bottom barrier layer. In one embodiment, the isolating layer is adapted to provide better interface with the second bottom barrier layer than the gate dielectric layer, as described in further detail below. In one embodiment, where barrier layer 102 lacks the second bottom barrier layer, and has a first bottom barrier layer, the isolating layer that is different from the gate dielectric layer is deposited on the first bottom barrier layer. In one embodiment, the isolating layer is adapted to provide better interface with the first bottom barrier layer than the gate dielectric layer, as described in further detail below.

In one embodiment, substrate 101 includes a monocrystalline silicon (Si), germanium (Ge), silicon germanium (SiGe), III-V elements based materials, or any material or materials on which the transistor 100 may be made. In one embodiment, substrate 101 includes one or more layers of metallization for integrated circuits (not shown). The one or more metallization layers can be separated from adjacent metallization layers by dielectric material, e.g., interlayer dielectric (ILD) (not shown). The adjacent metallization layers may be electrically interconnected by vias (not shown). In some embodiments the substrate 101 may be a substantially single-crystal silicon material, a substantially single-crystal silicon material that is doped, a multi-crystal or multi-layer substrate.

In various embodiments, the substrate 101 can comprise germanium, germanium on silicon, or can be a silicon-on-insulator substrate. The substrate 101 may not comprise silicon in some embodiments, but may instead comprise a different material, such as a different semiconductor or a group III-V material such as GaAs or InP. The substrate 101 may include one or more material(s), device(s), or layer(s), or may be a single material without multiple layers.

As shown in FIG. 1, a buffer layer 111 is deposited on substrate 101. The buffer layer 111 is deposited to accommodate for a lattice mismatch between the substrate 101 and layers above the buffer layer 111 and to confine lattice dislocations and defects, as described in further detail below. In various embodiments the buffer layer 111 may have different numbers of layers or simply be a single layer. The buffer layer 111 comprises gallium arsenide in one embodiment, although other materials including GaSb or AlSb may be used in other embodiments. In some embodiments, device 100 lacks buffer layer 111, and barrier layer 102 is deposited directly onto the substrate 101. Buffer layer 111 can be formed by molecular beam epitaxy (MBE), migration enhanced epitaxy (MEE), metal-organic chemical vapor deposition (MOCVD), atomic layer deposition (ALD), chemical beam epitaxy (CBE), or other suitable technique known to one of ordinary skill in the art of electronic device manufacturing. The buffer layer 111 can be formed to the thickness in an approximate range from about 0.1 microns ($\mu$m) to about 5 $\mu$m, in one embodiment, or to another thickness in various embodiments. In other embodiments, buffer layer 111 has the sufficient thickness that most defects present at its bottom surface are not present at its top surface. In one embodiment, buffer layer 111 has the thickness about 1 $\mu$m.

A bottom barrier layer 102 is deposited on the buffer layer 111. In one embodiment, the bottom barrier layer 102 comprises InAlAs. Note that as used herein, when materials designated by their elements without subscripts, these designations encompass any mix of percentages of the elements. For example, "InGaAs" encompasses $In_xGa_{1-x}As$, with x ranging between zero (GaAs) and one (InAs). In embodiments where the bottom barrier layer 102 comprises InAlAs, it may comprise $In_xAl_{1-x}As$, with x between 0.52 and 0.70, although different compositions may be used in other embodiments. In one embodiment, the bottom barrier layer 102 includes antimonide, for example, AlAsSb, AlGaAsSb, AlGaSb, indium, for example, InP, or a combination thereof, e.g., AlInSb. In one embodiment, bottom barrier layer 102 includes the second bottom barrier layer for example, InP deposited on the first bottom barrier layer, for example, InAlAs. In one embodiment, bottom barrier layer 102 includes the second bottom barrier layer, for example, AlAsSb, AlGaAsSb, AlGaSb, or AlInSb deposited on the first bottom barrier layer, for example, InAlAs. In other embodiments bottom barrier layer 102 can comprise other materials that are adapted to provide better interface with the gate dielectric layer than InAlAs. The bottom barrier layer 102 may be doped. In one embodiment, the bottom barrier layer 102 comprises a material with a greater band gap than the material of which the channel of the fin 103 is comprised. The bottom barrier layer 102 including second bottom barrier layer, first bottom barrier layer, or both can be formed by molecular beam epitaxy (MBE), migration enhanced epitaxy (MEE), metal-organic chemical vapor deposition (MOCVD), atomic layer deposition (ALD), chemical beam epitaxy (CBE), or other suitable technique known to one of ordinary skill in the art of electronic device manufacturing. In some embodiments, the bottom barrier layer 102 may have a thickness between about one micron and three microns or less. In an embodiment, the bottom barrier layer 102 has the thickness less than 1 μm, and more specifically, less than 500 nanometers (nm). In one embodiment the thickness of the bottom barrier layer 102 is about 100 nanometers, and in other embodiments it may have yet other thicknesses, as described in further detail below.

In one embodiment, fin 103 comprises a group III-V material quantum well channel region (not shown). In one embodiment, the group III-V material of the channel of the fin 103 is InGaAs. In other embodiments the channel of the fin 103 comprises other materials such as InAs, InAsSb, or InSb. The material of the fin 103 is adapted to provide a lattice match to surrounding regions. For example, where the quantum well channel region comprises InGaAs, the ratio of In to Ga may be selected to give the quantum well channel region a rough lattice match to surrounding regions. For example, in an embodiment where the bottom barrier layer 102 comprises In0.52Al0.48As, the channel region of the fin may comprise In0.53Ga0.47As. In other embodiments, the channel region of the fin 103 comprises $In_xGa_{1-x}As$, with x being between about 0.53 and about 1.0 (in which case there is substantially no Ga). In one embodiment, the channel region of the fin 103 comprises As-rich InAsSb. In one embodiment, the channel region of the fin 103 comprises high mobility/low Eg InSb. In one embodiment, the channel region 103 comprises high mobility/low Eg Sb-rich InAsSb. In one embodiment, the channel region 103 comprises $In_xAsSb_{1-x}$, where x ranges from about 0 to about 1. For example, the channel region 103 can comprise InSb. In another example, the channel region 103 can comprise In0.1AsSb0.9. In one embodiment, the fin 103 having InGaAs channel is deposited on the InP second bottom barrier layer on the InAlAs first bottom barrier layer. In one embodiment, fin 103 having an $In_xGa_{1-x}As$ channel, with x being between about 0.53 and about 1.0, is formed on $AlAs_xSb_{1-x}$ second bottom barrier layer, with x being between about 0 (100% AlSb) to about 0.5 (50% Sb) on the InAlAs first bottom barrier layer. In one embodiment, fin 103 having an $In_xGa_{1-x}As$ channel, with x being between about 0.53 and about 1.0 is formed on $Al_xGa_{1-x}As_ySb_{1-y}$ second bottom barrier layer with x being in an approximate range from about 0.5 (50% Ga) to about 0.9 (10% Ga) and y being in an approximate range from about 0 (100% Sb, e.g., AlGaSb) to about 0.5 (50% Sb) on the InAlAs first bottom barrier layer. In one embodiment, fin 103 having an $In_xGa_{1-x}As$ channel, with x being between about 0.53 and about 1.0, is formed on an InP second bottom barrier layer on the InAlAs first bottom barrier layer. In one embodiment, fin 103 having an InAs or As-rich InAsSb channel is formed on $Al_xGa_{1-x}Sb$ second bottom barrier layer with x being in an approximate range from 0 (100% Ga, e.g., GaSb) to 1 (100% Al e.g., AlSb) on the InAlAs first bottom barrier layer. In one embodiment, fin 103 having an InAs or As-rich InAsSb channel is formed on $AlAs_xSb_{1-x}$ second bottom barrier layer with x being in an approximate range from about 0 (100% Sb e.g., AlSb) to about 0.1 (90% Sb) on the InAlAs first bottom barrier layer. In one embodiment, fin 103 having an InAs or As-rich InAsSb channel is formed on an InP second bottom barrier layer on the InAlAs first bottom barrier layer. In one embodiment, fin 103 having a very high mobility/low Eg Sb-rich InAsSb or InSb channel is formed on an $Al_xIn_{1-x}Sb$ second bottom barrier layer with x being in an approximate range from about 0.2 (20% Al) to about 1 (100% Al e.g., AlSb) on the InAlAs first bottom barrier layer. In one embodiment, fin 103 having a very high mobility/low Eg Sb-rich InAsSb or InSb channel is formed on an InP second bottom barrier layer on the InAlAs first bottom barrier layer. It is appreciated that for the thin second bottom barrier layer, e.g., having the thickness in an approximate range of 4 nm to 10 nm, the lattice mismatch is not a problem and any barrier material with a good interface can be used for any different kind of channel material. It is also appreciated that when the second bottom barrier layer is very thin, e.g., less than 10 nm, the second bottom barrier layer is quantized that increases its band gap relative to a bulk material band gap that increases an isolation.

In one embodiment, forming the fin 103 includes depositing a fin layer on the upper barrier layer; patterning the fin layer; and etching the fin layer, as described in further detail below. As shown in FIG. 1, fin 103 has a width 113 and a height 112, and a length 114 along an axis orthogonal to width 113 and height 112. In one embodiment, width 113 is in an approximate range from about 1 nm to about 30 nm, and more specifically, from about 5 nm to about 10 nm. In one embodiment, the length of the fin is greater than the width and is determined by a design of the electronic device. In one embodiment, the length of the fin is from about 50 nm to hundreds of microns.

In an embodiment the fin height 112 is in an approximate range from about 5 nm to about 50 nm, and more specifically, from about 20 nm to about 40 nm. In an embodiment, width 113 and height 112 are less than 30 nm and more specifically, less than 20 nm. In an embodiment, the fin height 112 is between ½ the fin width 113 to 2 times the fin width 113.

In one embodiment, transistor 100 is a tri-gate transistor, and fin 103 has three sides configured for a tri-gate transistor. In one embodiment, transistor 100 is a nanowire transistor, and fin 103 has a nanowire of a III-V semiconductor material. In one embodiment, transistor is a nanoribbon transistor and fin 103 includes a nanoribbon of a III-V semiconductor material.

As shown in FIG. 1, a gate dielectric layer 105 is deposited on the fin 103. The gate dielectric layer 105, is formed on and around the sides of the semiconductor fin 103. As shown in FIG. 1, gate dielectric layer 105 is formed on or adjacent to sidewall 110, on top surface 108 and on or adjacent to sidewall 109 of fin 103. In one embodiment, the quantum well channel region of the fin 103 is a quantum well stack having a top barrier layer (not shown) deposited on the channel region of the fin, and the gate dielectric layer 105 is deposited on the top barrier layer. In one embodiment, the top barrier layer has a band gap greater than the band gap of the material of the channel.

In one embodiment, gate dielectric layer 105 is a high-k dielectric material having a dielectric constant (permittivity κ) greater than the dielectric constant of silicon dioxide. In one embodiment, electrically insulating layer 103 comprises a high-k dielectric material, for example, tantalum silicate (TaSiOx), aluminum oxide (e.g., Al2O3), although other materials such as La2O3, HfO2, ZrO2, TaO5, or ternary complexes such as LaAlxOy, HfxZryOz or other materials may be used in other embodiments. In embodiment, gate dielectric 105 is deposited on the fin 103 using an atomic layer deposition (ALD) process, although other methods known to one of ordinary skill in the art of electronic device manufacturing to form gate dielectric 105 may be used. In an embodiment, the gate dielectric 105 has a thickness between about 0.1 nm and 5 nm. In another embodiment, the gate dielectric has a thickness less than 5 nm, and more specifically, about 4 nm. In other embodiments the gate dielectric 105 may have different thicknesses.

In one embodiment, the gate dielectric layer 105 is adjacent to the second bottom barrier layer underneath the fin (not shown), as described in further detail below. In one embodiment, fin 103 is spaced apart from other fins (not shown) on substrate 101 by a pitch as determined by a non-planar transistor array design. In one embodiment, fin 103 is spaced apart from other fins by the pitch that is less than about 30 nm.

As shown in FIG. 1, a gate electrode 107 is deposited on the gate dielectric layer 105. Gate electrode 107 is formed on and around the gate dielectric layer 105. Gate electrode 107 is formed on or adjacent to gate dielectric 103 formed on sidewall 110 of the fin 103, is formed on gate dielectric 103 formed on the top surface 108 of the semiconductor fin 103, and is formed adjacent to or on gate dielectric layer 105 formed on sidewall 109 of semiconductor fin 103.

As shown in FIG. 1, gate electrode 107 has a pair of laterally opposite sidewalls, such as a sidewall 115 and a sidewall 116 separated by a distance which defines the gate length of the fin transistor.

Gate electrode 107 can be formed of any suitable gate electrode material. The gate electrode 107 may comprise a metal-containing material such as Pt/Au, Ti/Au, Ti/Pt/Au, or another material or materials. In various embodiments, the material or materials of the gate electrode 107 may be chosen to provide a desired work function. In an embodiment, the gate electrode 107 can be a metal gate electrode, such as but not limited to, tungsten, tantalum, titanium, and their nitrides. It is to be appreciated, the gate electrode 107 need not necessarily be a single material and can be a composite stack of thin films, such as but not limited to a polycrystalline silicon/metal electrode or a metal/polycrystalline silicon electrode.

A source region 104 and a drain region 106 are formed on the fin 103 at opposite sides of gate electrode 107, as shown in FIG. 1. In an embodiment, the source region 104 and drain region 106 have a doping concentration of between 1×1019, and 1×1021 atoms/cm3. The portion of the fin 103 underneath gate electrode 107 located between the source and drain regions 104 and 106, defines a channel region of a transistor. The channel region 120 can also be defined as the area of the semiconductor fin 103 surrounded by the gate electrode 107. At times however, the source/drain region may extend slightly beneath the gate electrode through, for example, diffusion to define a channel region slightly smaller than the gate electrode length (Lg). In an embodiment, the channel region of the fin 103 is intrinsic or undoped. In an embodiment, channel region of the fin 103 is doped, for example to a conductivity level of between 1×1016 to 1×1019 atoms/cm3. In an embodiment, when the channel region is doped it is typically doped to the opposite conductivity type of the source region 104 and the drain region 106. For example, when the source and drain regions 104 and 106 are n-type conductivity the channel region of the fin 103 is doped to p-type conductivity. For example, when the source and drain regions 104 and 106 are p-type conductivity the channel region of the fin 103 is n-type conductivity. In this manner a non-planar transistor 100 can be formed into either a NMOS transistor or a PMOS transistor respectively.

In an embodiment, source region 104 is electrically coupled to a source landing pad (not shown) and the drain region 106 is electrically coupled to a drain landing pad (not shown). Alternatively, the source region 104 and drain region 106 can be coupled to higher levels of metallization (e.g., metal 1, metal 2, metal 3, and so on) used to electrically interconnect various components of the integrated circuit together into functional circuits. Source region 104 and drain region 106 can be formed using one of techniques known to one of ordinary skill in the art of electronic device manufacturing.

Figure 2A:
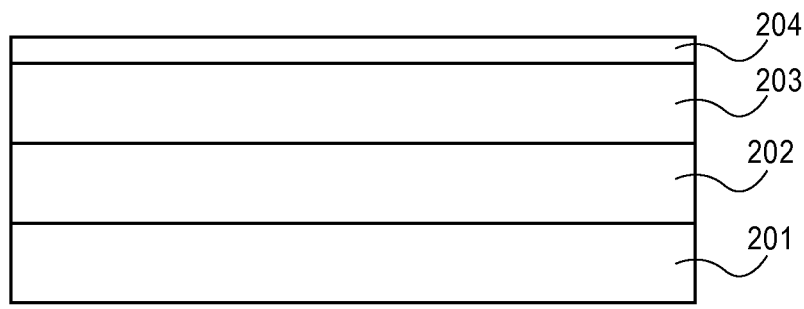
FIG. 2A is a cross-sectional view of a wafer to provide a non-planar III-V transistor according to one embodiment of the invention.

FIG. 2A is a cross-sectional view of a wafer 200 to provide a non-planar III-V transistor according to one embodiment of the invention. As shown in FIG. 2, a buffer layer 202 is deposited on a substrate 201. A first bottom barrier layer 203 is deposited on buffer layer 202. A second bottom barrier layer 204 is deposited on first bottom barrier layer 203. Substrate 201 can be any of the substrates, as described above. Buffer layer 202 is deposited to accommodate for a lattice mismatch between the substrate 201 and layers above the buffer layer 202, such as bottom barrier layer 203 and to confine lattice dislocations and defects, as described above.

In one embodiment, the buffer layer 202 includes a nucleation region (not shown), a first buffer region (not shown), and a graded buffer region (not shown) to accommodate for a lattice mismatch between the substrate and barrier layer 203. Buffer layer 202 can be buffer layer 111, as described above with respect to FIG. 1.

A bottom barrier layer 203 is deposited on buffer layer 202, as shown in FIG. 2A. In one embodiment, the bottom barrier layer 203 comprises InAlAs, although other III-V materials may be used in other embodiments. In one embodiment, bottom barrier layer 203 includes $In_xAl_{1-x}As$, with x between about 0.52 and about 0.70, although different compositions may be used in other embodiments. In one embodiment, barrier layer 203 includes $In_xAl_{1-x}As$ with x being about 0.52. Bottom barrier layer 203 can be deposited on buffer layer 202 by molecular beam epitaxy (MBE), migration enhanced epitaxy (MEE), metal-organic chemical vapor deposition (MOCVD), atomic layer deposition (ALD), chemical beam epitaxy (CBE), or other suitable technique known to one of ordinary skill in the art of electronic device manufacturing. Bottom barrier layer 203 can be deposited onto buffer layer 202 to the thickness from about 0.5 μm to about 3 μm, and more specifically, about 1 μm. In an embodiment, the bottom barrier layer 203 has the thickness less than 1 μm, and more specifically, less than 500 nm. In one embodiment the thickness of the bottom barrier layer 203 is about 100 nm, and in other embodiments it may have yet other thicknesses.

A bottom barrier layer 204 is deposited on bottom barrier layer 203, as shown in FIG. 2A. Bottom barrier layer 204 is adapted to have better interface with a gate dielectric layer than bottom barrier layer 203, as described below. Bottom barrier layer 204 has a band gap that is greater than the band gap of the fin, as described below. In one embodiment, the bottom barrier layer 204 includes antimonide, for example, AlAsSb, AlGaAsSb, AlGaSb. In one embodiment, bottom barrier layer 204 includes indium, for example, InP. In one embodiment, bottom barrier layer 204 includes AlInSb. In one embodiment, the bottom barrier layer 204, e.g., InP is deposited on the bottom barrier layer 203, e.g., InAlAs. In one embodiment, the bottom barrier layer 204, e.g., AlAsSb, AlGaAsSb, AlGaSb, or AlInSb is deposited on bottom barrier layer 203, for example, InAlAs. In other embodiments bottom barrier layer 204 can comprise other materials that are adapted to have better interface with the gate dielectric layer than bottom barrier layer 203.

Bottom barrier layer 204 can be deposited on bottom barrier layer 203 by molecular beam epitaxy (MBE), migration enhanced epitaxy (MEE), metal-organic chemical vapor deposition (MOCVD), atomic layer deposition (ALD), chemical beam epitaxy (CBE), or other suitable technique known to one of ordinary skill in the art of electronic device manufacturing. In one embodiment, bottom barrier layer 204 has the thickness in an approximate range from about 5 nm to about 50 nm, and more specifically, from about 30 nm to about 40 nm. In an embodiment, the bottom barrier layer 204 has the thickness in an approximate range from about 3 nm to about 10 nm, and in other embodiments it may have yet other thicknesses. It is appreciated that if the thin second bottom barrier layer, e.g., bottom barrier layer 204 has the thickness less than 10 nm the lattice mismatch is not a problem and any barrier material with good interfaces can be used for any different kind of channel material.

Figure 2B:
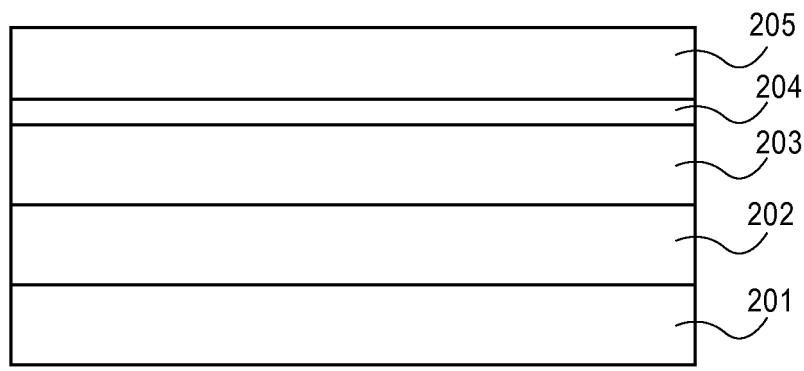
FIG. 2B is a view similar to FIG. 2A after a fin layer is deposited according to one embodiment of the invention.

FIG. 2B is a view 210 similar to FIG. 2A after a fin layer 205 is deposited on bottom barrier layer 204 according to one embodiment of the invention. In one embodiment, fin layer 205 has a substantial lattice match to surrounding layers, e.g., bottom barrier layers 204 and 203. In one embodiment, fin layer 205 comprises a group III-V material. In one embodiment, fin layer 205 includes InGaAs. In one embodiment, fin layer 205 comprises $In_xGa_{1-x}As$, with x being between about 0.53 and about 1.0. In other embodiments fin layer 205 comprises other materials such as InAs, InAsSb, or InSb. In one embodiment, fin layer 205 comprises As-rich InAsSb. In one embodiment, fin layer 205 comprises high mobility/low Eg InSb. In one embodiment, fin layer 205 comprises high mobility/low Eg Sb-rich InAsSb. In one embodiment, fin layer 205 e.g., InGaAs is deposited on the bottom barrier layer 204, e.g. InP that is formed on the bottom barrier layer 203, e.g InAlAs. In one embodiment, fin layer 205, e.g., $In_xGa_{1-x}As$ with x being between about 0.53 and about 1.0, is formed on bottom barrier layer 204, e.g., $AlAs_xSb_{1-x}$ with x being between about 0 (100% AlSb) to about 0.5 (50% Sb) on the bottom barrier layer 203, e.g. InAlAs. In one embodiment, fin layer 205, e.g., $In_xGa_{1-x}As$ with x being between about 0.53 and about 1.0 is formed on bottom barrier layer 204, e.g., $Al_xGa_{1-x}As_ySb_{1-y}$ with x being in an approximate range from about 0.5 (50% Ga) to about 0.9 (10% Ga) and y being in an approximate range from about 0 (100% Sb, e.g., AlGaSb) to about 0.5 (50% Sb) formed on the bottom barrier layer 203, e.g., InAlAs. In one embodiment, fin layer 205, e.g., InAs or As-rich InAsSb is formed on bottom barrier layer 204, e.g., $Al_xGa_{1-x}$ Sb with x being in an approximate range from 0 (100% Ga, e.g., GaSb) to 1 (100% Al e.g., AlSb) formed on the bottom barrier layer 203, e.g., InAlAs. In one embodiment, fin layer 205 e.g., an InAs or As-rich InAsSb channel is formed on bottom barrier layer 204 e.g., $AlAs_xSb_{1-x}$ with x being in an approximate range from about 0 (100% Sb e.g., AlSb) to about 0.1 (90% Sb) on the bottom barrier layer 203, e.g., InAlAs. In one embodiment, fin layer 205, e.g., a very high mobility/low Eg Sb-rich InAsSb or InSb is formed on bottom barrier layer 204, e.g. $Al_xIn_{1-x}Sb$ with x being in an approximate range from about 0.2 (20% Al) to about 1 (100% Al e.g., AlSb) formed on the bottom barrier layer 203, e.g., InAlAs. In one embodiment, the thickness of the fin layer 205 is in an approximate range from about 5 nm to about 50 nm, and more specifically, from about 20 nm to about 40 nm. In an embodiment, the thickness of the fin layer 205 is less than 30 nm and more specifically, less than 20 nm.

Fin layer 205 can be deposited using molecular beam epitaxy (MBE), migration enhanced epitaxy (MEE), metal-organic chemical vapor deposition (MOCVD), atomic layer deposition (ALD), chemical beam epitaxy (CBE), or other suitable technique known to one of ordinary skill in the art of electronic device manufacturing.

Figure 2C:
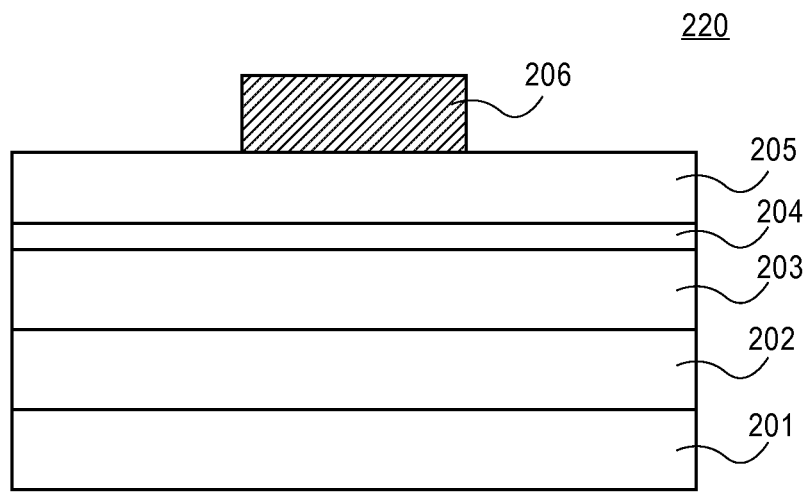
FIG. 2C is a view similar to FIG. 2B after a patterned feature is formed according to one embodiment of the invention.

FIG. 2C is a view 220 similar to FIG. 2B after a patterned feature 206 is formed on fin layer 205 according to one embodiment of the invention. The feature 206 defines a location where a semiconductor fin will be subsequently formed over the semiconductor substrate 201. In an embodiment, the width of the feature 206 defines a width the semiconductor fin. In an embodiment, the thickness of the feature 206 determines the fin height. In alternate embodiments, feature 206 includes a photoresist, a hard mask, or both. Depositing, and patterning the feature on fin layer 205 can be performed using any of photolithographic techniques known to one of ordinary skill in the art of electronic device manufacturing.

Figure 2D:
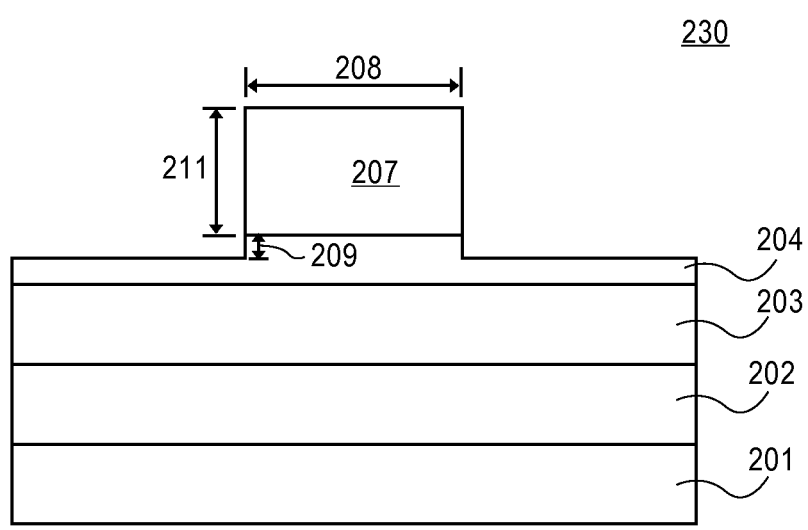
FIG. 2D is a view similar to FIG. 2C after a fin is formed according to one embodiment of the invention.

FIG. 2D is a view 230 similar to FIG. 2C after a fin 207 is formed from fin layer 205 on bottom barrier layer 204 according to one embodiment of the invention. In one embodiment, the portions of fin layer 205 not covered (exposed) by feature 206 are etched down to the bottom barrier layer 204 while the portions underneath feature 206 remain intact. In one embodiment, the fin layer 205 is etched for a predetermined time to ensure that the exposed portions of the fin layer 205 are completely etched down to the bottom barrier layer 204. In one embodiment, the fin layer 205 is selectively etched, while leaving bottom barrier layer 204 intact. In one embodiment, an etch stop layer (e.g., a nitride layer) is deposited on the bottom barrier layer 204.

In one embodiment, etching of the fin layer 205 causes recessing the exposed portions of the bottom barrier layer 204 down to a distance 209 from the bottom of the fin 207. In one embodiment, the bottom barrier layer 204 is thick enough to ensure that etching of the fin layer 205 does not cause etching of the bottom barrier layer 203. In one embodiment, distance 209 is from about 1 nm to about 30 nm.

As shown in FIG. 2D, the fin 207 has a top surface and opposing side sidewalls. As shown in FIG. 2D, fin 207 has a width 208 between the opposing sidewalls and a height 211 from the bottom of the fin to the top surface of the fin 207. The height 211 and width 208 can be any of widths and heights as described above with respect to FIG. 1.

The fin layer 205 can be etched using a dry etch, e.g., a reactive ion etching (RIE) technique known to one of ordinary skill in the art of electronic device manufacturing. In one embodiment, the dry etching of the fin layer 205 is followed by a dilute citric-phosphoric etching as a cleaning etch to remove the III-V material of the fin layer 205 damaged in the RIE etch. In one embodiment, bottom barrier layer 204 has a band gap greater than the band gap of the fin 207. In one embodiment, bottom barrier layer 204 has a band gap greater than the band gap of the fin 207.

Figure 2E:
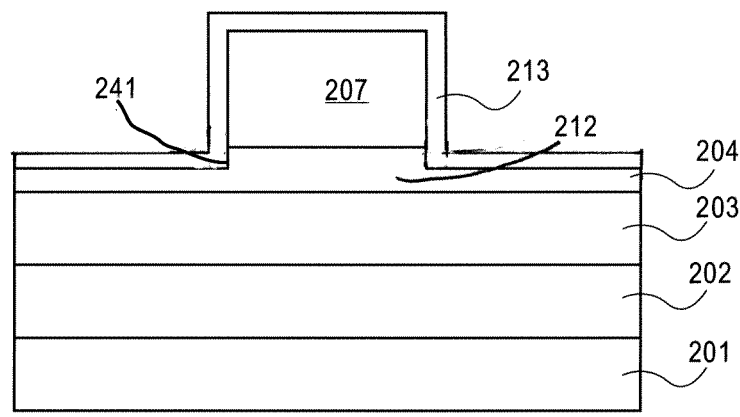
FIG. 2E is a view similar to FIG. 2D after a gate dielectric layer is formed according to one embodiment of the invention.

FIG. 2E is a view 240 similar to FIG. 2D after a gate dielectric layer 213 is formed on fin 207 according to one embodiment of the invention. As shown in FIG. 2E, gate dielectric layer 213 covers the top surface and the opposing sidewalls of the fin 207, and the sidewalls of a portion 212 of barrier layer 204 underneath the fin 207. As shown in FIG. 2E, portion 212 of the barrier layer 204 underneath the fin 207 has not been recessed. In one embodiment, the bottom barrier layer 204 has an interface 241 with the gate dielectric layer 213 that is substantially better than the barrier layer 203 would have had. In one embodiment, bottom barrier layer 204 is adapted to provide substantially less density of interface traps with the gate dielectric layer 213 than the bottom barrier layer 203.

In one embodiment, gate dielectric layer 213 comprises a high-k dielectric material, for example, tantalum silicate (TaSiOx), aluminum oxide (e.g., Al2O3). In one embodiment gate dielectric layer 213 comprises TaSiO2. In one embodiment, gate dielectric layer 213 comprises La2O3, HfO2, ZrO2, TaO5, or ternary complexes such as LaAlxOy, HfxZryOz or other materials. Gate dielectric layer 213 can be any of the dielectric layers as described above with respect to FIG. 1. In an embodiment, the gate dielectric 213 has a thickness between about 0.1 nm and 5 nm. In another embodiment, the gate dielectric 213 has a thickness less than 5 nm, and more specifically, about 4 nm. In other embodiments the gate dielectric 213 may have different thicknesses. Gate dielectric layer 213 can be deposited on the fin 207 and barrier layer 204 using any of the deposition techniques as described above with respect to FIG. 1. Gate dielectric layer 213 can be patterned using any of suitable patterning and etching techniques, which are known to one of ordinary skill in the art of electronic device manufacturing.

Figure 2F:
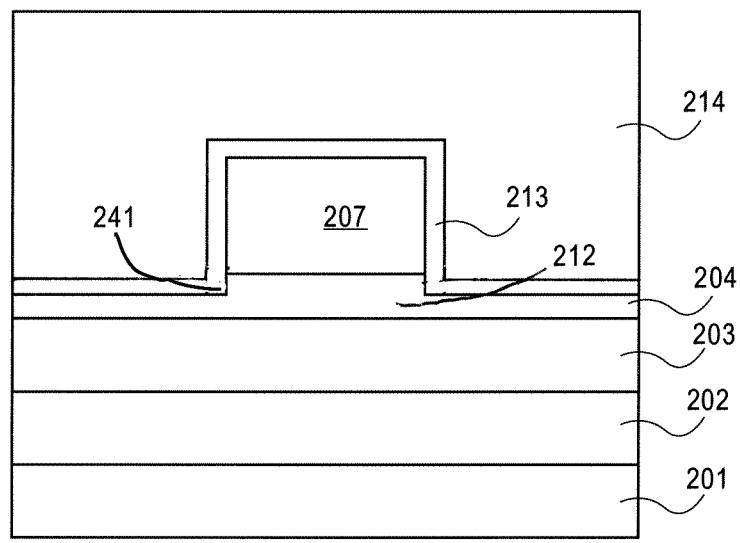
FIG. 2F is a view similar to FIG. 2E after a gate electrode is formed according to one embodiment of the invention.

FIG. 2F is a view 250 similar to FIG. 2E after a gate electrode 214 is formed on gate dielectric layer 213 according to one embodiment of the invention. A gate electrode 214 can be formed on gate dielectric layer 213 by deposition and patterning techniques, which are known to one of ordinary skill in the art of transistor fabrication. Gate electrode 214 can comprise a metal-containing material such as Pt/Au, Ti/Au, Ti/Pt/Au, or other material or materials, as described above. In an embodiment, the thickness of the gate electrode 214 is from about 50 nm to about 500 nm. In other embodiments, gate electrode 214 can have other thicknesses. The gate electrode 215 can be gate electrode 107 depicted in FIG. 1. In one embodiment, a source region and a drain region (not shown) are formed on fin 207 at opposite sides of the gate electrode 214, as described above with respect to FIG. 1.

Figure 3A:
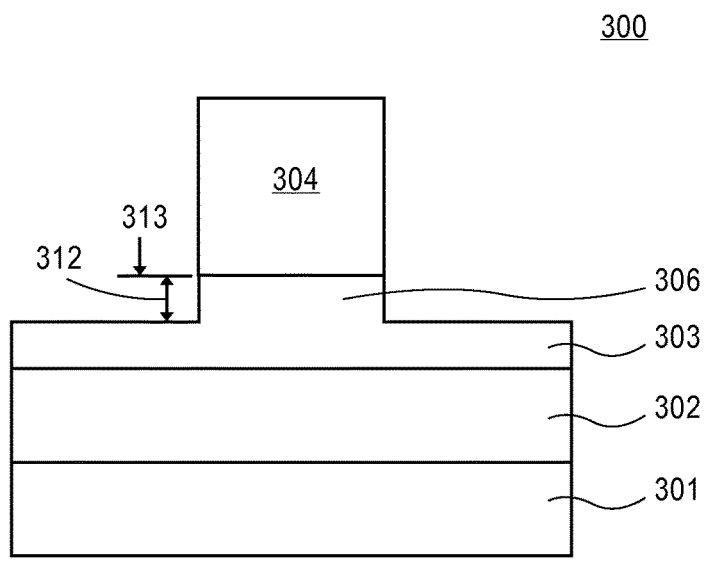
FIG. 3A is a cross-sectional view of a wafer to provide a non-planar III-V transistor according to another embodiment of the invention.

FIG. 3A is a cross-sectional view of a wafer 300 to provide a non-planar III-V transistor according to another embodiment of the invention. As shown in FIG. 3A, a fin 304 is formed on a bottom barrier layer 303 on a buffer layer 302 on a substrate 301. In one embodiment, bottom barrier layer 303 has a band gap greater than the band gap of the fin 304. As shown in FIG. 3A, fin 304 has a top surface and opposing side sidewalls.

Substrate 301 can be any of the substrates, as described above. Buffer layer 302 is deposited to accommodate for a lattice mismatch between the substrate 301 and layers above the buffer layer 302, such as bottom barrier layer 303 and to confine lattice dislocations and defects, as described above.

A bottom barrier layer 303 is deposited on buffer layer 302, as shown in FIG. 3A. In one embodiment, the bottom barrier layer 303 comprises InAlAs. In one embodiment, bottom barrier layer 303 includes $In_xAl_{1-x}As$, with x between about 0.52 and about 0.70, although different compositions may be used in other embodiments. In one embodiment, barrier layer 303 includes $In_xAl_{1-x}As$ with x being about 0.52.

In one embodiment, the bottom barrier layer 303 includes antimonide, for example, AlAsSb, AlGaAsSb, AlGaSb, indium, for example, InP, or a combination thereof, e.g., AlInSb. In other embodiments bottom barrier layer 303 can comprise other III-V materials.

Bottom barrier layer 303 can be deposited on buffer layer 302 by any of suitable technique as described above. Bottom barrier layer 303 can be deposited onto buffer layer 302 to the thickness from about 0.5 μm to about 3 μm, and more specifically, about 1 μm. In an embodiment, the bottom barrier layer 303 has the thickness less than 1 μm, and more specifically, less than 500 nm. In one embodiment the thickness of the bottom barrier layer 303 is about 100 nm, and in other embodiments it may have yet other thicknesses. In one embodiment, the fin layer is selectively etched, while leaving bottom barrier layer 303 intact. In one embodiment, an etch stop layer (e.g., a nitride layer) is deposited on the bottom barrier layer 303.

In one embodiment, forming fin 304 involves etching the exposed portions of the fin layer down to the bottom barrier layer 303, as described above with respect to FIGS. 2C and 2D. In one embodiment, etching of the fin layer causes recessing the exposed portions of the bottom barrier layer 303 down to a distance 312 from a fin bottom 313 while leaving the portion 306 of the bottom barrier layer 303 underneath the fin 304 intact, as described above with respect to FIG. 2D. In one embodiment, distance 312 is in an approximate range from about 1 nm to about 30 nm. The height and width of the fin 304 can be any of widths and heights as described above. Fin 304 can be formed using any of the suitable techniques as described above.

Figure 3B:
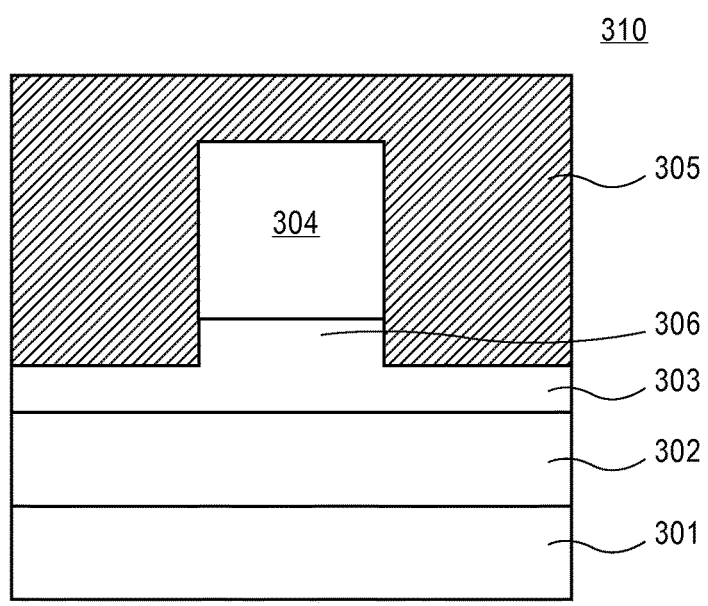
FIG. 3B is a view similar to FIG. 3A, after an isolating layer is deposited according to one embodiment of the invention.

FIG. 3B is a view 310 that is similar to FIG. 3A, after an isolating layer 305 is deposited on the fin and bottom barrier layer 303 according to one embodiment of the invention. As shown in FIG. 3B, isolating layer 305 covers the top and sidewall surfaces of the fin 304, and the sidewalls of the portion 306 of the bottom barrier layer 303 underneath fin 304. In one embodiment, isolating layer 305 is adapted to provide better interface with the bottom barrier layer 303 than the gate dielectric layer would have provided. In one embodiment, isolating layer 305 includes an oxide layer. In one embodiment, isolating layer 305 includes a low permittivity (low-k) ILD layer. Typically, low-k is referred to the dielectrics having dielectric constant (permittivity k) lower than the permittivity of silicon dioxide. In one embodiment, isolating layer 305 is a shallow trench isolation (STI) layer comprising one or more dielectric materials, e.g., silicon dioxide and other dielectric materials known to one of ordinary skill in the art of electronic device manufacturing.

In one embodiment, isolating layer 305 comprises a high-k dielectric material, for example, tantalum silicate (TaSiOx), aluminum oxide (e.g., Al2O3), La2O3, HfO2, ZrO2, TaO5, ternary complexes such as LaAlxOy, HfxZryOz or other dielectric materials. Isolating layer 305 can be blanket deposited on the fin 304 using any of techniques known to one of ordinary skill in the art of electronic device manufacturing, such as but not limited to a Chemical Vapour Deposition (CVD), a Physical Vapour Deposition (PVP).

Figure 3C:
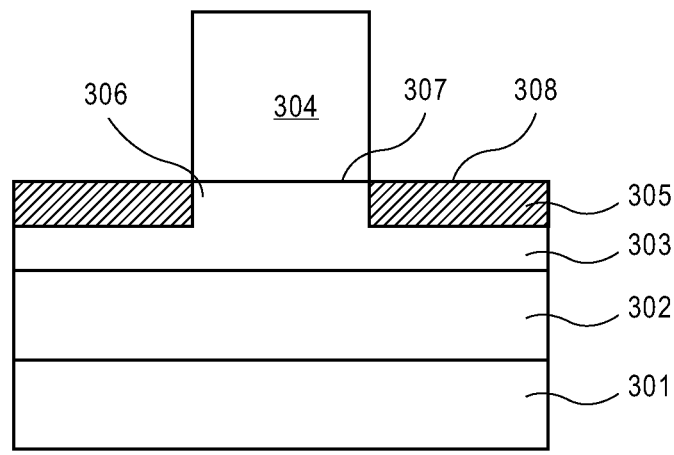
FIG. 3C is a view similar to FIG. 3B after an isolating layer is recessed according to one embodiment of the invention.

FIG. 3C is a view 320 that is similar to FIG. 3B after isolating layer 305 is recessed according to one embodiment of the invention. As shown in FIG. 3C, isolating layer 305 is recessed down to an interface 307 between the fin 304 and the bottom barrier layer 303. Isolating layer 305 is placed on the barrier layer 303 and is adjacent to the sidewalls of the portion 306 of the barrier layer 303 underneath the fin 304.

In one embodiment, isolating layer 305 is recessed after being polished back by, for example, a chemical-mechanical polishing ("CMP"), to expose the top surface of the fin 304.

Isolating layer 305 can be recessed by a selective etching technique while leaving the fin 304 intact. For example, isolating layer 305 can be recessed using a selective etching technique known to one of ordinary skill in the art of electronic device manufacturing, such as but not limited to a wet etching, and a dry etching with the chemistry having substantially high selectivity to the fin 304. This means that the chemistry predominantly etches the isolating layer 305 rather than the fin 304, as known to one of ordinary skill in the art of electronic device manufacturing.

Figure 3D:
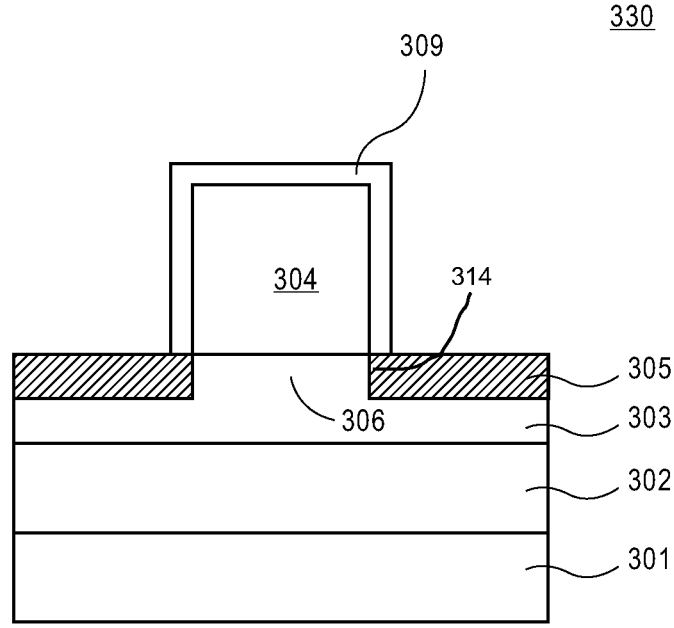
FIG. 3D is a view similar to FIG. 3C, after a gate dielectric layer is formed according to one embodiment of the invention.

FIG. 3D is a view 330 similar to FIG. 3C, after a gate dielectric layer 309 is formed on the fin 304 according to one embodiment of the invention. As shown in FIG. 3D, gate dielectric layer 309 is placed on the top surface and the opposing side sidewalls of the fin 304 and isolating layer 305 covers sidewalls of the portion 306 of the barrier layer 303 underneath the fin 304. In one embodiment, isolating layer 306 is different from the gate dielectric layer 309. In one embodiment, isolating layer 305 has an interface 314 with the portion 306 of the barrier layer 303 that is substantially better than the dielectric layer 309 would have had. In one embodiment, isolating layer 305 is adapted to provide substantially less density of interface traps with the barrier layer 303 than the gate dielectric layer 309. Gate dielectric layer 309 can be any of the gate dielectric layers as described above, for example, with respect to FIG. 1. Gate dielectric layer 309 can be deposited on the fin 309 and the isolating layer 305 using any of the suitable deposition techniques as described above. Gate dielectric layer 309 can be patterned using any of suitable patterning and etching techniques, which are known to one of ordinary skill in the art of electronic device manufacturing.

Figure 3E:
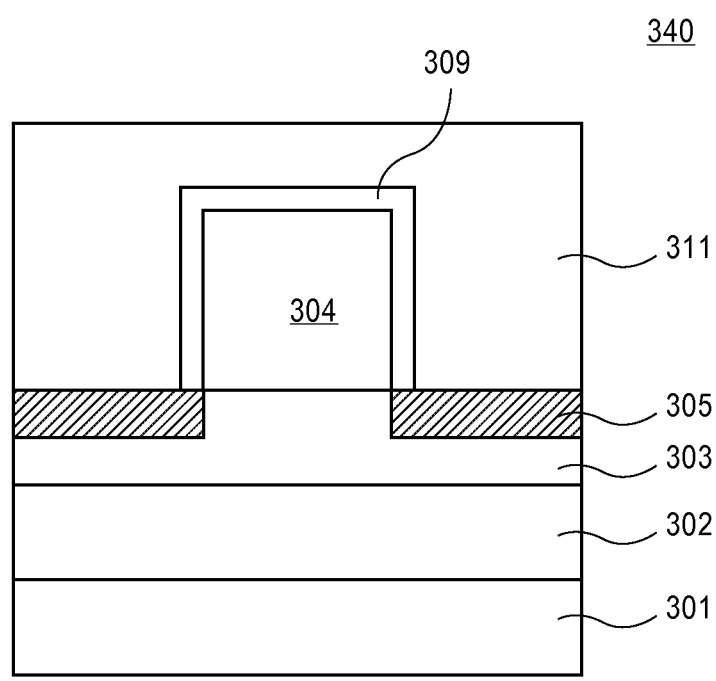
FIG. 3E is a view similar to FIG. 3D, after a gate electrode is formed according to one embodiment of the invention.

FIG. 3E is a view 340 similar to FIG. 3D, after a gate electrode 311 is formed on gate dielectric layer 309 and isolating layer 305 according to one embodiment of the invention.

Gate electrode 311 can be formed on gate dielectric layer 309 by deposition and patterning techniques, which are known to one of ordinary skill in the art of transistor fabrication. Gate electrode 311 can comprise a metal-containing material such as Pt/Au, Ti/Au, Ti/Pt/Au, or other material or materials, as described above. In an embodiment, the thickness of the gate electrode 214 is from about 50 nm to about 500 nm. In other embodiments, gate electrode 214 can have other thicknesses. The gate electrode 311 can be gate electrode 107 depicted in FIG. 1. In one embodiment, a source region and a drain region (not shown) are formed on fin 304 at opposite sides of the gate electrode 311, as described above with respect to FIG. 1.

Figure 3F:
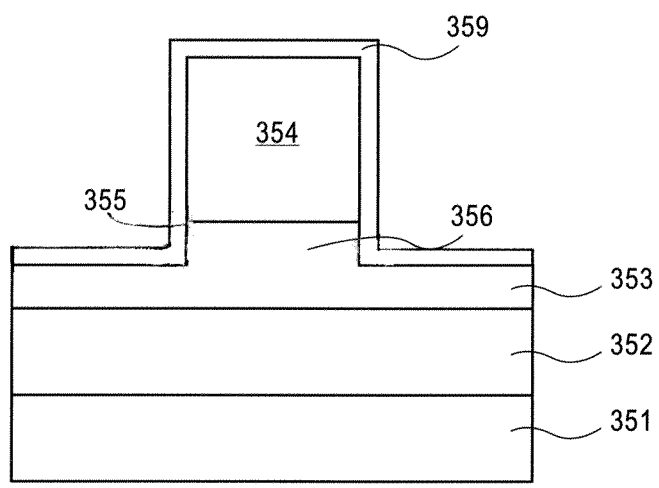
FIG. 3F shows a cross-sectional view of an example of a typical wafer to provide a non-planar III-V transistor.

FIG. 3F shows a cross-sectional view of an example of a typical wafer 350 to provide a non-planar III-V transistor. As shown in FIG. 3F, tantalum silicate gate dielectric 359 covers an $In_{0.7}Ga_{0.3}As$ fin 354 and the portion 356 of the $In_{0.52}Al_{0.48}As$ bottom barrier layer 353 underneath the fin. An interface 355 between the gate dielectric 359 and portion 356 of the bottom barrier layer 353 underneath the fin 354 has interface traps.

Referring back to FIG. 3D, interface 314 between the isolating layer 305 and barrier layer 303 has substantially less density of the interface traps than an interface 355 between the gate dielectric layer 359 and bottom barrier layer 353 depicted in FIG. 3F.

Referring back to FIG. 2E, interface 241 between barrier layer 204 and gate dielectric 213 has substantially less density of interface traps than interface 355 between the gate dielectric layer 359 and bottom barrier layer 353 depicted in FIG. 3F.

Figure 4A:
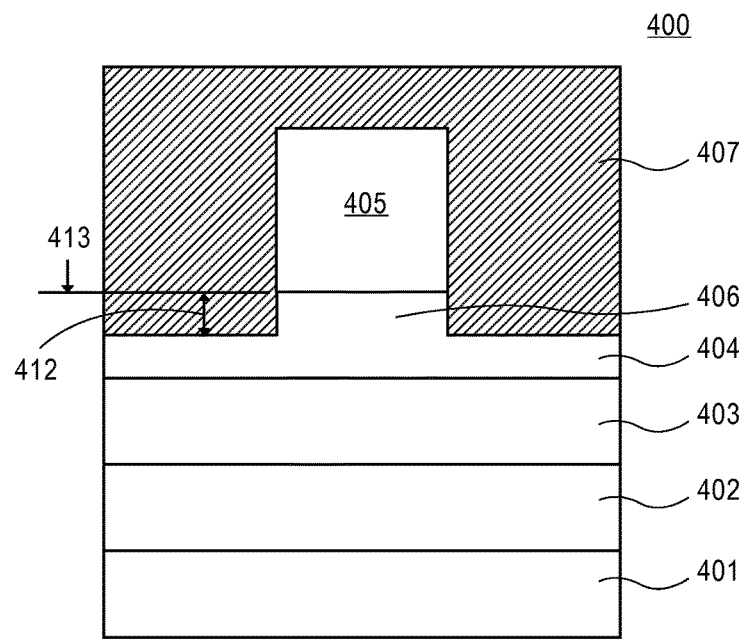
FIG. 4A is a cross-sectional view of a wafer to provide a non-planar III-V transistor according to another embodiment of the invention.

FIG. 4A is a cross-sectional view of a wafer 400 to provide a non-planar III-V transistor according to another embodiment of the invention. As shown in FIG. 4A, a fin 405 is formed on a bottom barrier layer 404 on a bottom barrier layer 403 on a buffer layer 402 on a substrate 401. An isolating layer 407 is deposited on the fin 405 and bottom barrier layer 404. In one embodiment, each of the bottom barrier layer 404 and bottom barrier layer 403 has a band gap greater than the band gap of the fin 405. As shown in FIG. 4A, fin 405 has a top surface and opposing side sidewalls.

Substrate 401 can be any of the substrates, as described above. Buffer layer 402 is deposited to accommodate for a lattice mismatch between the substrate 401 and layers above the buffer layer 402 to confine lattice dislocations and defects, as described above.

A bottom barrier layer 403 is deposited on buffer layer 402, as shown in FIG. 4A. In one embodiment, the bottom barrier layer 403 comprises InAlAs, although other III-V materials may be used in other embodiments. In one embodiment, bottom barrier layer 403 includes $In_xAl_{1-x}As$, with x between about 0.52 and about 0.70, although different compositions may be used in other embodiments. In one embodiment, barrier layer 403 includes $In_xAl_{1-x}$ As with x being about 0.52.

In one embodiment, bottom barrier layer 404 is adapted to have better interface with a gate dielectric layer than bottom barrier layer 403. In one embodiment, the bottom barrier layer 404 includes antimonide, for example, AlAsSb, AlGaAsSb, AlGaSb. In one embodiment, bottom barrier layer 404 includes indium, for example, InP. In one embodiment, bottom barrier layer 404 includes AlInSb. In one embodiment, the bottom barrier layer 404, e.g., InP is deposited on the bottom barrier layer 403, e.g., InAlAs. In one embodiment, the bottom barrier layer 404, e.g., AlAsSb, AlGaAsSb, AlGaSb, or AlInSb is deposited on bottom barrier layer 403, for example, InAlAs. In other embodiments bottom barrier layer 404 can comprise other materials that are adapted to have better interface with the gate dielectric layer than bottom barrier layer 403.

Bottom barrier layer 403 can be deposited on buffer layer 402 by any of suitable technique as described above. Bottom barrier layer 403 can be deposited onto buffer layer 402 to the thickness from about 0.5 μm to about 3 μm, and more specifically, about 1 μm. In an embodiment, the bottom barrier layer 403 has the thickness less than 1 μm, and more specifically, less than 500 nm. In one embodiment the thickness of the bottom barrier layer 403 is about 100 nm, and in other embodiments it may have yet other thicknesses.

Bottom barrier layer 404 can be deposited on bottom barrier layer 403 by molecular beam epitaxy (MBE), migration enhanced epitaxy (MEE), metal-organic chemical vapor deposition (MOCVD), atomic layer deposition (ALD), chemical beam epitaxy (CBE), or other suitable technique known to one of ordinary skill in the art of electronic device manufacturing. In one embodiment, bottom barrier layer 404 has the thickness in an approximate range from about 5 nm to about 50 nm, and more specifically, from about 30 nm to about 40 nm. In an embodiment, the bottom barrier layer 404 has the thickness in an approximate range from about 3 nm to about 10 nm, and in other embodiments it may have yet other thicknesses.

In one embodiment, forming fin 405 involves etching the exposed portions of the fin layer down to the bottom barrier layer 404, as described above. In one embodiment, the fin layer is selectively etched, while leaving bottom barrier layer 404 intact. In one embodiment, an etch stop layer (e.g., a nitride layer) is deposited on the bottom barrier layer 404. In one embodiment, etching of the fin layer causes recessing the exposed portions of the bottom barrier layer 404 down to a distance 412 from a fin bottom 413 while leaving the portion 406 of the bottom barrier layer 404 underneath the fin 405 intact, as described above. In one embodiment, the bottom barrier layer 404 is thick enough to ensure that etching of the fin layer does not cause etching of the bottom barrier layer 403, as described above. In one embodiment, distance 412 is in an approximate range from about 1 nm to about 30 nm. The height and width of the fin 405 can be any of widths and heights as described above. Fin 405 can be formed using any of the suitable techniques as described above.

As shown in FIG. 4A, isolating layer 407 covers the top and sidewall surfaces of the fin 405, and the sidewalls of the portion 406 of the bottom barrier layer 404 underneath fin 405. In one embodiment, isolating layer 407 is adapted to provide better interface with the bottom barrier layer 404 than the gate dielectric layer would have provided. In one embodiment, isolating layer 407 includes an oxide layer. In one embodiment, isolating layer 407 includes a low permittivity (low-k) ILD layer. In one embodiment, isolating layer 407 is a shallow trench isolation (STI) layer comprising one or more dielectric materials, e.g., silicon dioxide and other dielectric materials known to one of ordinary skill in the art of electronic device manufacturing.

In one embodiment, isolating layer 407 comprises a high-k dielectric material, for example, tantalum silicate ($TaSiO_x$), aluminum oxide (e.g., $Al_2O_3$), $La_2O_3$, $HfO_2$, $ZrO_2$, $TaO_5$, ternary complexes such as $LaAlxO_y$, $Hf_xZr_yO_z$ or other dielectric materials. Isolating layer 407 can be blanket deposited on the fin 304 using any of techniques known to one of ordinary skill in the art of electronic device manufacturing, such as but not limited to a Chemical Vapour Deposition (CVD), a Physical Vapour Deposition (PVP).

Figure 4B:
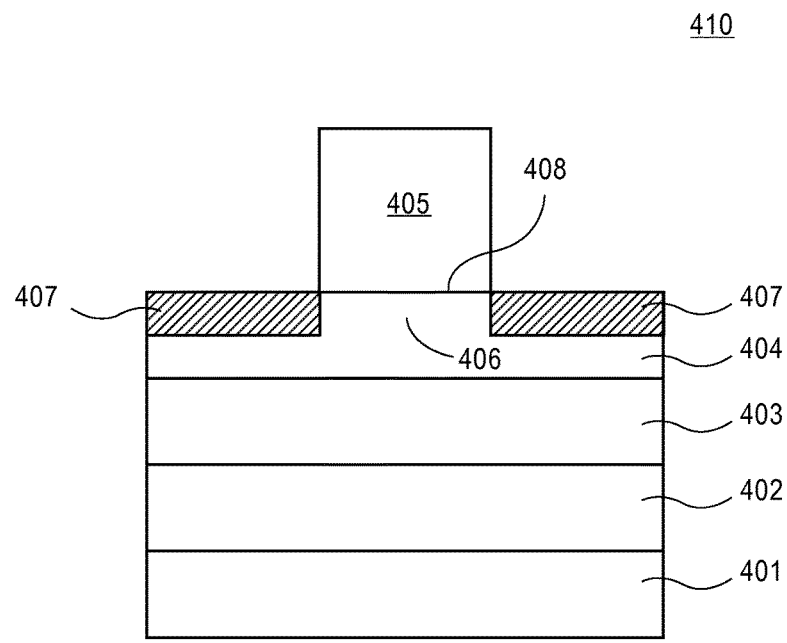
FIG. 4B is a view similar to FIG. 4A after isolating layer is recessed according to one embodiment of the invention.

FIG. 4B is a view 400 that is similar to FIG. 4A after isolating layer 407 is recessed according to one embodiment of the invention. As shown in FIG. 4B, isolating layer 407 is recessed down to an interface 408 between the fin 405 and the bottom barrier layer 404. Isolating layer 407 is placed on the barrier layer 303 and is adjacent to the sidewalls of the portion 406 of the barrier layer 404 underneath the fin 405. In one embodiment, isolating layer 407 is recessed after being polished back by, for example, a chemical-mechanical polishing ("CMP"), as described above. Isolating layer 407 can be recessed by a selective etching technique, as described above.

Figure 4C:
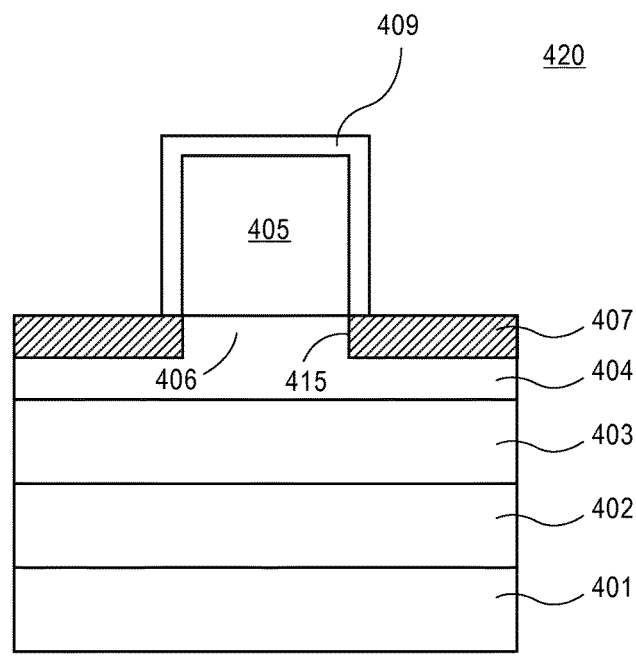
FIG. 4C is a view similar to FIG. 4B, after a gate dielectric layer is formed according to one embodiment of the invention.

FIG. 4C is a view 420 similar to FIG. 4B, after a gate dielectric layer 409 is formed on the fin 405 according to one embodiment of the invention. As shown in FIG. 4C, gate dielectric layer 409 is placed on the top surface and the opposing side sidewalls of the fin 405 and isolating layer 407 covers sidewalls of the portion 406 of the barrier layer 404 underneath the fin 404. In one embodiment, isolating layer 407 is different from the gate dielectric layer 409. In one embodiment, isolating layer 407 has an interface 415 with the portion 406 of the barrier layer 404 that is substantially better than the dielectric layer 409 would have had. In one embodiment, isolating layer 407 is adapted to provide substantially less density of interface traps with the barrier layer 404 than the gate dielectric layer 409 would have provided.

Gate dielectric layer 409 can be any of the gate dielectric layers as described above. Gate dielectric layer 409 can be formed on the fin 309 and the isolating layer 305 using any of the suitable techniques known to one of ordinary skill in the art, as described above.

Figure 4D:
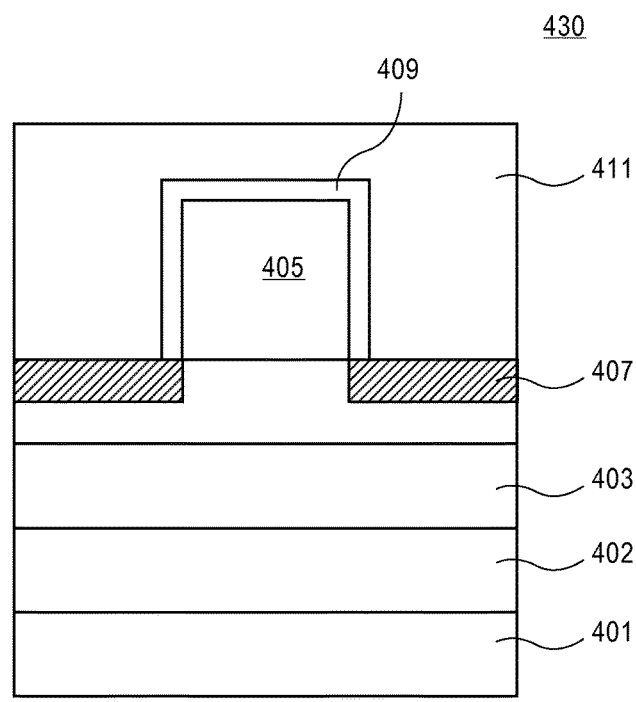
FIG. 4D is a view similar to FIG. 4C, after a gate electrode is formed according to one embodiment of the invention.

FIG. 4D is a view 430 similar to FIG. 4C, after a gate electrode 411 is formed on gate dielectric layer 409 and isolating layer 407 according to one embodiment of the invention.

Gate electrode 411 can be formed on gate dielectric layer 409 by deposition and patterning techniques, which are known to one of ordinary skill in the art of transistor fabrication. Gate electrode 311 can comprise a metal-containing material such as Pt/Au, Ti/Au, Ti/Pt/Au, or other material or materials, as described above. In an embodiment, the thickness of the gate electrode 214 is from about 50 nm to about 500 nm. In other embodiments, gate electrode 214 can have other thicknesses. The gate electrode 411 can be gate electrode 107 as depicted in FIG. 1. In one embodiment, a source region and a drain region (not shown) are formed on fin 405 at opposite sides of the gate electrode 411, as described above. In one embodiment, interface 415 has substantially less density of interface traps than interface 355 depicted in FIG. 3F.

FIG. 5 is an exemplary graph 500 showing a current (I) 501 versus a gate voltage (Vg) 502 of a III-V transistor having a structure similar to that of FIG. 3F. A curve 503 is obtained at a drain bias 500 mV at which a typical processor is operated. A curve 504 is obtained at a drain bias 50 mV. A curve 505 is a simulation curve. As shown in FIG. 5, the off state leakage current (at Vg less than 0) increases with increasing the drain bias. As shown in FIG. 5, for a drain bias 500 mV the off state leakage current (at Vg below 0) due to poor interface between a gate oxide and InAlAs bottom barrier layer below the fin (sub fin leakage) is at least about 5 to 10 times greater than a simulated leakage current.

FIG. 6A is an exemplary graph 600 showing a gate capacitance 601 versus a gate voltage 602 for a 40 angstrom (Å) Al2O3-InAlAs interface at different frequencies. FIG. 6B is an exemplary graph showing a gate capacitance 611 versus a gate voltage 612 for a 40 Å Al2O3-InP interface at different frequencies. Frequency dispersion from curve 603 at 100 kHz to curve 604 at 1 MHz for Al2O3-InAlAs interface is 27% per decade that is much greater than 7% per decade frequency dispersion from curve 613 at 100 kHz to curve 614 at 1 MHz for Al2O3-InP interface. In at least some embodiments, greater frequency dispersion of the capacitance versus voltage curves indicates higher density of interface traps through which off-state leakage may occur. As shown in FIG. 5, an Al2O3-InP interface has at least an order of magnitude less density of interface traps than an Al2O3-InAlAs interface has.

Figure 7:
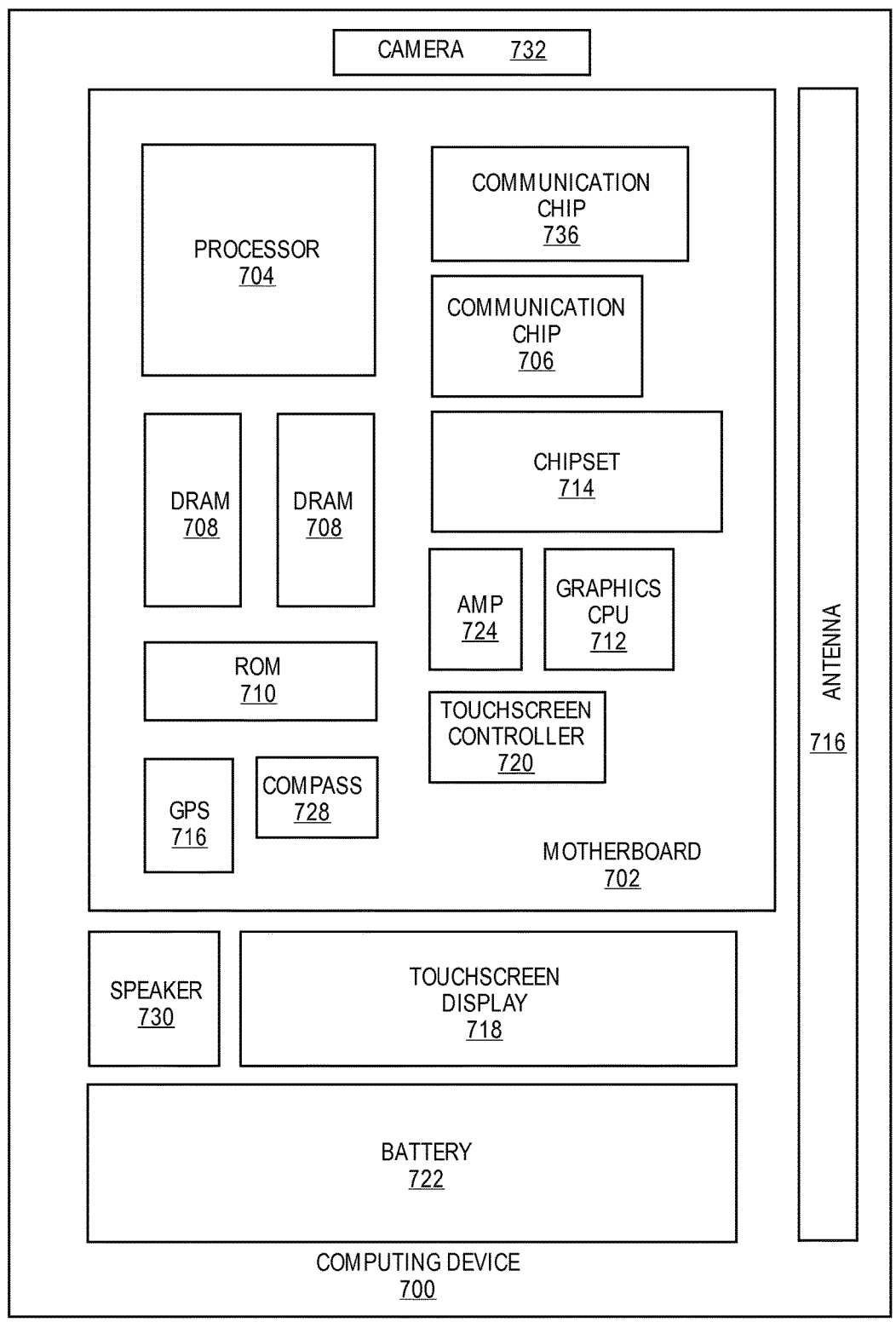
FIG. 7 illustrates a computing device in accordance with one embodiment of the invention.

FIG. 7 illustrates a computing device 700 in accordance with one embodiment of the invention. The computing device 700 houses a board 702. The board 702 may include a number of components, including but not limited to a processor 704 and at least one communication chip 706. The processor 704 is physically and electrically coupled to the board 702. In some implementations the at least one communication chip is also physically and electrically coupled to the board 702. In further implementations, at least one communication chip 706 is part of the processor 704.

Depending on its application, computing device 700 may include other components that may or may not be physically and electrically coupled to the board 702. These other components include, but are not limited to, a memory, such as a volatile memory 708 (e.g., a DRAM), a non-volatile memory 710 (e.g., ROM), a flash memory, an exemplary graphics processor 712, a digital signal processor (not shown), a crypto processor (not shown), a chipset 714, an antenna 716, a display, e.g., a touchscreen display 718, a display controller, e.g., a touchscreen controller 720, a battery 722, an audio codec (not shown), a video codec (not shown), an amplifier, e.g., a power amplifier 724, a global positioning system (GPS) device 726, a compass 728, an accelerometer (not shown), a gyroscope (not shown), a speaker 1130, a camera 732, and a mass storage device (such as hard disk drive, compact disk (CD), digital versatile disk (DVD), and so forth) (not shown).

A communication chip, e.g., communication chip 706, enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips. For instance, a communication chip 706 may be dedicated to shorter range wireless communications such as Wi-Fi and Bluetooth and a communication chip 736 may be dedicated to longer range wireless communications such as GPS, EDGE, GPRS, CDMA, WiMAX, LTE, Ev-DO, and others.

In at least some embodiments, the processor 704 of the computing device 700 includes an integrated circuit die having a III-V transistor having the isolation leakage prevented according to embodiments described herein. The integrated circuit die of the processor includes one or more devices, such as transistors or metal interconnects as described herein. The term "processor" may refer to any device or portion of a device that processes electronic data from registers and/or memory to transform that electronic data into other electronic data that may be stored in registers and/or memory.

The communication chip 1006 also includes an integrated circuit die package having a III-V transistor with the isolation leakage prevented according to the embodiments described herein. In further implementations, another component housed within the computing device 1000 may contain an integrated circuit die package having a III-V transistor with the isolation leakage prevented according to the embodiments described herein.
In accordance with one implementation, the integrated circuit die of the communication chip includes one or more devices, such as transistors and metal interconnects, as described herein. In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Embodiments described herein provide an advantage of a new interface having substantially low density of interface traps at the bottom barrier layer to reduce the isolation leakage. A new interface as described herein has at least 2 times less density of interface traps than current state of the art that provides significant reduction in isolation leakage in III-V transistors.

The following examples pertain to further embodiments:

A method to manufacture an electronic device, comprising: depositing a first barrier layer over a substrate; depositing a second barrier layer on the first barrier layer; forming a fin on the second barrier layer, wherein at least one of the first barrier layer and the second barrier layer has a band gap that is greater than the band gap of the fin, the fin having a top surface and opposing sidewalls; and depositing a gate dielectric layer on the top surface and the opposing sidewalls.

A method to manufacture an electronic device, comprising: depositing a first barrier layer over a substrate; depositing a second barrier layer on the first barrier layer; forming a fin on the second barrier layer, wherein at least one of the first barrier layer and the second barrier layer has a band gap that is greater than the band gap of the fin, the fin having a top surface and opposing sidewalls; and depositing a gate dielectric layer on the top surface and the opposing sidewalls, wherein the gate dielectric layer is adjacent to the second barrier layer underneath the fin.

A method to manufacture an electronic device, comprising: depositing a first barrier layer over a substrate; depositing a second barrier layer on the first barrier layer; forming a fin on the second barrier layer, wherein at least one of the first barrier layer and the second barrier layer has a band gap that is greater than the band gap of the fin, the fin having a top surface and opposing sidewalls; and depositing a gate dielectric layer on the top surface and the opposing sidewalls, wherein forming the fin includes depositing a fin layer on the second barrier layer; patterning the fin layer; and etching the fin layer.

A method to manufacture an electronic device, comprising: depositing a first barrier layer over a substrate; depositing a second barrier layer on the first barrier layer; forming a fin on the second barrier layer, wherein at least one of the first barrier layer and the second barrier layer has a band gap that is greater than the band gap of the fin, the fin having a top surface and opposing sidewalls; depositing a gate dielectric layer on the top surface and the opposing sidewalls, depositing an isolating layer on the second barrier layer, wherein the isolating layer is different from the gate dielectric layer; and recessing the isolating layer down to an interface between the fin and the second barrier layer.

A method to manufacture an electronic device, comprising: depositing a first barrier layer over a substrate; depositing a second barrier layer on the first barrier layer; forming a fin on the second barrier layer, wherein at least one of the first barrier layer and the second barrier layer has a band gap that is greater than the band gap of the fin, the fin having a top surface and opposing sidewalls; and depositing a gate dielectric layer on the top surface and the opposing sidewalls, wherein the fin includes indium, and the second barrier layer includes antimonide, indium, or a combination thereof.

A method to manufacture an electronic device, comprising forming a fin over a first barrier layer over a substrate, wherein the first barrier layer has a band gap greater than the band gap of the fin, wherein the fin has a top surface and opposing side sidewalls; depositing an isolating layer on the first barrier layer; recessing the isolating layer; and depositing a gate dielectric layer on the top surface and the opposing side sidewalls.

A method to manufacture an electronic device, comprising forming a fin over a first barrier layer over a substrate, wherein the first barrier layer has a band gap greater than the band gap of the fin, wherein the fin has a top surface and opposing side sidewalls; depositing an isolating layer on the first barrier layer; recessing the isolating layer; and depositing a gate dielectric layer on the top surface and the opposing side sidewalls, wherein the isolating layer is recessed down to an interface between the fin and the first barrier layer.

A method to manufacture an electronic device, comprising forming a fin over a first barrier layer over a substrate, wherein the first barrier layer has a band gap greater than the band gap of the fin, wherein the fin has a top surface and opposing side sidewalls; depositing an isolating layer on the first barrier layer; recessing the isolating layer; and depositing a gate dielectric layer on the top surface and the opposing side sidewalls, wherein the isolating layer is different from the gate dielectric layer.

A method to manufacture an electronic device, comprising forming a fin over a first barrier layer over a substrate, wherein the first barrier layer has a band gap greater than the band gap of the fin, wherein the fin has a top surface and opposing side sidewalls; depositing an isolating layer on the first barrier layer; recessing the isolating layer; and depositing a gate dielectric layer on the top surface and the opposing side sidewalls, wherein the isolating layer is adjacent to the first barrier layer underneath the fin.

A method to manufacture an electronic device, comprising forming a fin over a first barrier layer over a substrate, wherein the first barrier layer has a band gap greater than the band gap of the fin, wherein the fin has a top surface and opposing side sidewalls; depositing an isolating layer on the first barrier layer; recessing the isolating layer; depositing a gate dielectric layer on the top surface and the opposing side sidewalls; depositing a second barrier layer on the first barrier layer, wherein the fin is on the second barrier layer, and the isolating layer is adjacent to the second barrier layer underneath the fin.

An electronic device, comprising: a first barrier layer over a substrate; a second barrier layer on the first barrier layer; a fin having a top surface and opposing sidewalls on the second barrier layer, wherein the second barrier layer has a band gap greater than the band gap of the fin; and a gate dielectric layer on the top surface and the opposing sidewalls.

An electronic device, comprising: a first barrier layer over a substrate; a second barrier layer on the first barrier layer; a fin having a top surface and opposing sidewalls on the second barrier layer, wherein the second barrier layer has a band gap greater than the band gap of the fin; and a gate dielectric layer on the top surface and the opposing sidewalls, wherein the gate dielectric is adjacent to the second barrier layer underneath the fin.

An electronic device, comprising: a first barrier layer over a substrate; a second barrier layer on the first barrier layer; a fin having a top surface and opposing sidewalls on the second barrier layer, wherein the second barrier layer has a band gap greater than the band gap of the fin; and a gate dielectric layer on the top surface and the opposing sidewalls, wherein the fin includes indium, and the second barrier layer includes antimonide, indium, or a combination thereof.

An electronic device, comprising: a first barrier layer over a substrate; a second barrier layer on the first barrier layer; a fin having a top surface and opposing sidewalls on the second barrier layer, wherein the second barrier layer has a band gap greater than the band gap of the fin; and a gate dielectric layer on the top surface and the opposing sidewalls, wherein the second barrier layer has a thickness from 1 nm to 50 nm.

An electronic device, comprising: a first barrier layer over a substrate; a second barrier layer on the first barrier layer; a fin having a top surface and opposing sidewalls on the second barrier layer, wherein the second barrier layer has a band gap greater than the band gap of the fin; a gate dielectric layer on the top surface and the opposing sidewalls, and an insulating layer adjacent to the second barrier layer underneath the fin.

An electronic device, comprising a fin having a top surface and opposing sidewalls over a first barrier layer over a substrate, the first barrier layer having a band gap greater than the band gap of the fin; an isolating layer over the first layer; and a gate dielectric layer on the top surface and the opposing sidewalls, wherein the isolating layer is different from the gate dielectric layer.

An electronic device, comprising a fin having a top surface and opposing sidewalls over a first barrier layer over a substrate, the first barrier layer having a band gap greater than the band gap of the fin; an isolating layer over the first layer; and a gate dielectric layer on the top surface and the opposing sidewalls, wherein the isolating layer is different from the gate dielectric layer, wherein the isolating layer is adjacent to the first barrier layer underneath the fin.

An electronic device, comprising a fin having a top surface and opposing sidewalls over a first barrier layer over a substrate, the first barrier layer having a band gap greater than the band gap of the fin; an isolating layer over the first layer; and a gate dielectric layer on the top surface and the opposing sidewalls, wherein the isolating layer is different from the gate dielectric layer, a second barrier layer between the fin and the first barrier layer, the second barrier layer having a band gap greater than the band gap of the fin.

An electronic device, comprising a fin having a top surface and opposing sidewalls over a first barrier layer over a substrate, the first barrier layer having a band gap greater than the band gap of the fin; an isolating layer over the first layer; and a gate dielectric layer on the top surface and the opposing sidewalls, wherein the isolating layer is different from the gate dielectric layer, wherein the fin includes indium, and the second barrier layer includes antimonide, indium, or a combination thereof.

An electronic device, comprising a fin having a top surface and opposing sidewalls over a first barrier layer over a substrate, the first barrier layer having a band gap greater than the band gap of the fin; an isolating layer over the first layer; and a gate dielectric layer on the top surface and the opposing sidewalls, wherein the isolating layer is different from the gate dielectric layer, wherein the isolating layer has a thickness from 1 nm to 50 nm.

What is claimed is:
1. An electronic device, comprising:
a first barrier layer over a substrate;
a second barrier layer on the first barrier layer;
a fin having a top surface and opposing sidewalls on the second barrier layer, wherein the second barrier layer has a band gap greater than a band gap of the fin, the second barrier layer comprising a first portion under- neath the fin and a recess portion comprising a sidewall extending to a first distance in a direction from the fin towards the substrate; and a gate dielectric layer on the top surface, the opposing sidewalls, and on the sidewall of the recess portion of the, wherein the second barrier layer is configured to provide less density of interface traps with the gate dielectric layer than the first barrier layer.

2. The electronic device of claim 1, wherein the sidewall is adjacent to the first portion of the second barrier layer underneath the fin.

3. The electronic device of claim 1, wherein the fin includes indium, and the second barrier layer includes antimonide, indium, or a combination thereof.

4. The electronic device of claim 1, wherein the second barrier layer has a thickness from 1 nm to 50 nm.

5. An electronic device, comprising
a fin having a top surface and opposing sidewalls on a first barrier layer over a substrate, the first barrier layer having a band gap greater than a band gap of the fin, the first barrier layer comprising a first portion underneath the fin and a recess portion comprising a sidewall extending to a first distance in a direction from the fin towards the substrate;
an isolating layer on the sidewall of the recess portion of the first barrier layer; and
a gate dielectric layer on the top surface and the opposing sidewalls, wherein the isolating layer is different from the gate dielectric layer, wherein the isolating layer is configured to provide less density of interface traps with the first barrier layer than the gate dielectric layer.

6. The electronic device of claim 5, wherein the sidewall is adjacent to the first portion of the first barrier layer underneath the fin.

7. The electronic device of claim 5, further comprising
a second barrier layer between the fin and the first barrier layer, the second barrier layer having a band gap greater than the band gap of the fin.

8. The electronic device of claim 7, wherein the fin includes indium, and the second barrier layer includes antimonide, indium, or a combination thereof.

9. The electronic device of claim 5, wherein the isolating layer has a thickness from 1 nm to 50 nm.

10. A mobile computing device, comprising
a memory, and a processor coupled to the memory, wherein the processor includes
an integrated circuit die comprising a first barrier layer over a substrate;
a second barrier layer on the first barrier layer;
a fin having a top surface and opposing sidewalls on the second barrier layer, the second barrier layer comprising a first portion underneath the fin and a recess portion comprising a sidewall extending to a first distance in a direction from the fin towards the substrate, wherein the second barrier layer has a band gap greater than the band gap of the fin; and
a gate dielectric layer on the top surface, the opposing sidewalls, and on the sidewall of the recess portion of the second barrier layer, wherein the second barrier layer is configured to provide less density of interface traps with the gate dielectric layer than the first barrier layer.

11. A mobile computing device, comprising
a memory, and a processor coupled to the memory, wherein the processor includes
a fin having a top surface and opposing sidewalls on a first barrier layer over a substrate, the first barrier layer having a band gap greater than the band gap of the fin, the first barrier layer comprising a first portion underneath the fin and a recess portion comprising a sidewall extending to a first distance in a direction from the fin towards the substrate;
an isolating layer on the sidewall of the recess portion of the first barrier layer; and a gate dielectric layer on the top surface and the opposing sidewalls, wherein the isolating layer is different from the gate dielectric layer, wherein the isolating layer is configured to provide less density of interface traps with the first barrier layer than the gate dielectric layer.

* * * * *